(12) United States Patent
Sun et al.

(10) Patent No.: US 10,396,209 B2
(45) Date of Patent: *Aug. 27, 2019

(54) THIN FILM TRANSISTOR COMPRISING LIGHT SHIELDING LAYERS, ARRAY SUBSTRATE AND MANUFACTURING PROCESSES OF THEM

(71) Applicant: BOE Technology Group Co., Ltd., Beijing (CN)

(72) Inventors: Hongda Sun, Beijing (CN); Youngsuk Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/955,349

(22) Filed: Apr. 17, 2018

(65) Prior Publication Data

US 2018/0240911 A1 Aug. 23, 2018

Related U.S. Application Data

(63) Continuation of application No. 15/315,762, filed as application No. PCT/CN2016/077484 on Mar. 28, 2016, now Pat. No. 9,978,876.

(30) Foreign Application Priority Data

Jun. 3, 2015 (CN) .......................... 2015 1 0301084

(51) Int. Cl.
*H01L 33/44* (2010.01)
*H01L 29/786* (2006.01)
(Continued)

(52) U.S. Cl.
CPC ...... *H01L 29/78633* (2013.01); *H01L 21/707* (2013.01); *H01L 27/1225* (2013.01);
(Continued)

(58) Field of Classification Search
None
See application file for complete search history.

(56) References Cited

U.S. PATENT DOCUMENTS 5,738,948 A * 4/1998 Ikeda ................ G02F 1/136286
420/429
5,744,821 A * 4/1998 Song ................ G02F 1/136209
257/59
(Continued)

FOREIGN PATENT DOCUMENTS

CN 1716068 A 1/2006
CN 1858911 A 11/2006
(Continued)

OTHER PUBLICATIONS

Jun. 22, 2016—International Search Report and Written Opinion Appn PCT/CN2016/077484 with Eng Tran.
(Continued)

*Primary Examiner* — Bilkis Jahan
(74) *Attorney, Agent, or Firm* — Banner & Witcoff, Ltd.

(57) ABSTRACT

A thin film transistor and a manufacturing method thereof, and an array substrate are disclosed. The thin film transistor includes a gate electrode, an insulating layer, an active layer and a source/drain electrode layer, and further includes a light shielding layer, and the light shielding layer is configured to block light from entering the active layer via the insulating layer, and the light shielding layer and the gate electrode are arranged in a same layer and electrically unconnected with each other. The thin film transistor can reduce the light irradiated to the active layer and thus reduce the adverse impact thus incurred.

17 Claims, 7 Drawing Sheets

(51) Int. Cl.
*H01L 21/70* (2006.01)
*H01L 33/00* (2010.01)
*H01L 51/52* (2006.01)
*H01L 51/56* (2006.01)
*H01L 27/12* (2006.01)

(52) U.S. Cl.
CPC ...... *H01L 27/1251* (2013.01); *H01L 29/7869* (2013.01); *H01L 33/005* (2013.01); *H01L 33/44* (2013.01); *H01L 51/52* (2013.01); *H01L 51/56* (2013.01)

(56) References Cited

U.S. PATENT DOCUMENTS

| | | | | |
|---|---|---|---|---|
| 5,821,622 | A * | 10/1998 | Tsuji | H01L 29/458 |
| | | | | 257/763 |
| 5,824,564 | A * | 10/1998 | Watanabe | H01L 27/1288 |
| | | | | 438/30 |
| 8,513,071 | B2 * | 8/2013 | Kim | H01L 29/41733 |
| | | | | 257/E21.414 |
| 9,978,876 | B2 * | 5/2018 | Sun | H01L 21/707 |
| 2005/0285989 | A1 | 12/2005 | Sakurai et al. | |
| 2006/0243979 | A1 | 11/2006 | Park et al. | |
| 2009/0225259 | A1 | 9/2009 | Choi | |
| 2011/0299005 | A1 | 12/2011 | Takeguchi et al. | |
| 2012/0168756 | A1 * | 7/2012 | Ryu | H01L 29/41733 |
| | | | | 257/59 |
| 2012/0299006 | A1 * | 11/2012 | Miyairi | H01L 29/78633 |
| | | | | 257/71 |
| 2012/0299070 | A1 * | 11/2012 | Yamada | H01L 31/02164 |
| | | | | 257/291 |
| 2013/0056732 | A1 | 3/2013 | Jung et al. | |
| 2014/0346458 | A1 * | 11/2014 | Park | H01L 27/1259 |
| | | | | 257/40 |

FOREIGN PATENT DOCUMENTS

| | | |
|---|---|---|
| CN | 102629051 A | 8/2012 |
| CN | 102722058 A | 10/2012 |
| CN | 104157696 A | 11/2014 |
| CN | 104992948 A | 10/2015 |

OTHER PUBLICATIONS

Jun. 28, 2017—(CN) First Office Action Appn 201510301084.7 with English Tran.

* cited by examiner

THIN FILM TRANSISTOR COMPRISING LIGHT SHIELDING LAYERS, ARRAY SUBSTRATE AND MANUFACTURING PROCESSES OF THEM

This application is a continuation of U.S. patent application Ser. No. 15/315,762 filed Feb. 6, 2017, which is a U.S. National Phase Entry of International Application No. PCT/CN2016/077484 filed on Mar. 28, 2016, designating the United States of America and claiming priority to Chinese Patent Application No. 201510301084.7 filed on Jun. 3, 2015. The present application claims priority to and the benefit of the above-identified applications and the above-identified applications are incorporated by reference herein in their entirety.

TECHNICAL FIELD

The embodiment of the present disclosure relates to the display technology field, more specifically, to a thin film transistor and manufacturing process thereof, an array substrate and a manufacturing process thereof.

BACKGROUND

As a new generation of display, OLED (Organic Light Emitting Diode) displays are widely used due their advantages such as self-emitting, quick response, wide viewing angle, or the like.

An OLED display comprises an array substrate on which a plurality of pixel units is formed in an array. Each of the pixel units comprises two thin film transistors, one serving as the switching thin film transistor functioning as a switch of the pixel unit and the other serving as the driving thin film transistor for driving the array substrate respectively. In the state of art, the active layers of the thin film transistors are usually made of an oxide semiconductor material. Nevertheless, oxide semiconductor materials are sensitive to the light, especially when the external light irradiates the active layer.

SUMMARY

An aspect of the embodiment of the present disclosure provides a thin film transistor, comprising a gate electrode, an insulating layer, an active layer and a source/drain electrode layer, and the thin film transistor further comprises a light shielding layer which is configured to block light from entering the active layer via the insulating layer, and the light shielding layer and the gate electrode are arranged in a same layer and electrically unconnected with each other.

Another aspect of the embodiment of the present disclosure provides an array substrate comprising a base substrate, wherein the thin film transistors as described above are formed on the base substrate.

Still another aspect of the embodiment of the present disclosure provides a process of manufacturing a thin film transistor comprising: forming a first conductive layer pattern including a gate electrode and a light shielding layer of a thin film transistor on a base substrate; forming an insulating layer covering the first conductive layer pattern; forming a semiconductor layer pattern including an active layer on the insulating layer at a position corresponding to the gate electrode; and forming a second conductive layer pattern including a source electrode and a drain electrode on the base substrate with the semiconductor layer pattern formed thereon.

Further still another aspect of the embodiment of the present disclosure provides a process of manufacturing an array substrate comprising: forming a first pattern including a gate electrode of a switching thin film transistor, a light shielding layer of a switching thin film transistor, a gate electrode of a driving thin film transistor, a light shielding layer of a driving thin film transistor and a scan line on a base substrate; forming an insulating layer covering the first pattern; forming a second pattern comprising an active layer of the switching thin film transistor and an active layer of the driving thin film transistor on the insulating layer; and forming a third pattern comprising a source/drain electrode layer of the switching thin film transistor, a source/drain electrode layer of the driving thin film transistor and a data line over the second pattern; wherein a source electrode of the switching thin film transistor is connected to the data line, a source electrode of the driving thin film transistor is connected to a power line, and the drain electrode of the switching thin film transistor is connected to the gate electrode of the driving thin film transistor.

BRIEF DESCRIPTION OF THE DRAWINGS

In order to clearly illustrate the technical solution of the embodiments of the present disclosure, the drawings of the embodiments will be briefly described in the following. It is obvious that the following drawings are related to some embodiments of the present disclosure only and thus not limitative to the present disclosure.

DETAILED DESCRIPTION

Figure 1:
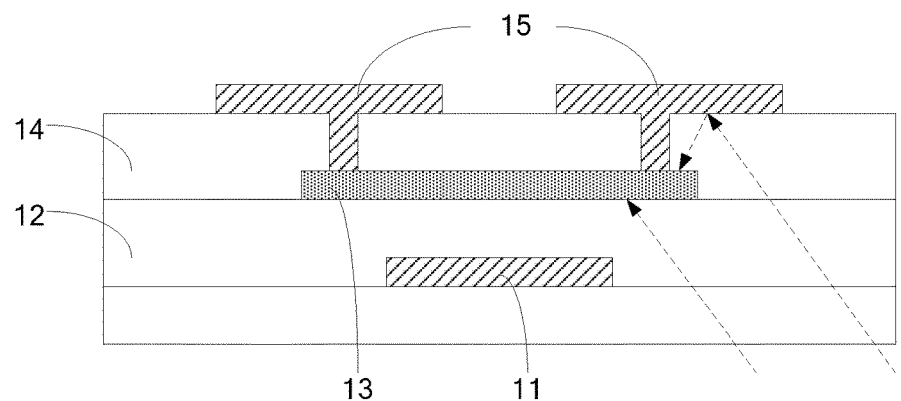
FIG. 1 schematically illustrates a known configuration of a thin film transistor.

FIG. 1 illustrates a layer configuration of a known thin film transistor, which comprises a gate electrode 11, an insulating layer 12, an active layer 13, an etch stop layer 14 and a source/drain electrode layer 15. External light is indicated by dashed arrows in FIG. 1. As illustrated in FIG. 1, the external light, which enters the active layer 13 made of an oxide semiconductor material via the insulating layer 12, has an adverse impact on the performance of the active layer 13, and may lead to the failure of the active layer 13 in severe cases, so that the performance of the manufactured thin film transistor may be impacted.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all the embodiments of the disclosure. Based on the described embodiments herein, those skilled in the art can obtain other embodiment(s), without any inventive work, which should be within the scope of the disclosure In all the embodiments of the present disclosure, "and/or" is used to describe the relationship between associated objects and involves three kinds of relationships. For example, "A and/or B" indicates the following three cases: only A is present; A and B are present simultaneously; and only B is present. Additionally, the character "/" in the embodiments of the present disclosure generally indicates that the associated objects before and after the character "/" are connected by "or".

Embodiment 1

Figure 2:
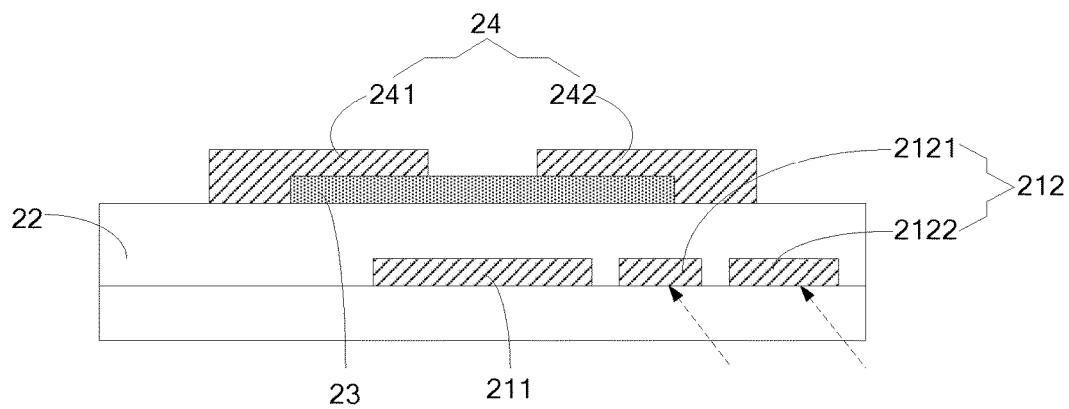
FIG. 2 schematically illustrates a configuration of a thin film transistor provided by the embodiments of the present disclosure.

As illustrated in FIG. 2, the embodiment of the present disclosure provides a thin film transistor. The thin film transistor comprises a gate electrode 211, an insulating layer 22, an active layer 23 and a source/drain electrode layer 24. Moreover, the thin film transistor comprises a light shielding layer 212 which can prevent light (the light from the bottom to top as indicated by dashed arrows in FIG. 2) from entering the active layer 23 via the insulating layer 22. The light shielding layer 212 is arranged in the same layer as the gate electrode 211 and electrically unconnected to the gate electrode 211.

The source/drain electrode layer 24 comprises a source electrode 241 and a drain electrode 242 of the thin film transistor.

In all embodiments of the present disclosure, the arrangement that more than two patterns are provided in the same layer refers to that these more than two patterns are obtained by patterning the same layer. It should be noted that, the same layer may include one or more thin films. Illustratively, with reference to FIG. 2, a first conductive layer may be formed on the base substrate and then patterned to form the light shielding layer 212 and the gate electrode 211. Thus, the light shielding layer 212 and the gate electrode 211 are provided is the same layer. For example, the patterning process may include the steps of masking, exposing, developing, etching, removing, etc. In other embodiments, the patterning process is not limited to these steps and may include other steps.

As illustrated in FIG. 2, the light shielding layer 212 can prevent the light from directly arriving at the active layer 23 via the insulating layer 22, and prevent the light passing through the insulating layer 22 and reflected from the source/drain electrode layer 24 from directly arriving at the active layer 23. The embodiments of the present disclosure are not limited in the size, thickness or the like of the light shielding layer 212, and thus those skilled in the art can select them as required.

Therefore, the thin film transistor provided by the embodiments of the present disclosure can prevent external light from entering the active layer via the insulating layer by way of the light shielding layer arranged in the same layer as the gate electrode, so as to decrease the external light entering the active layer and thus decrease the adverse impact of the external light on the active layer. Therefore, the thin film transistor with more stable performance is fabricated. Additionally, because the light shielding layer and the gate are arranged in the same layer, they can be formed in the same patterning process, and thus no one more patterning process is needed.

Figure 3:
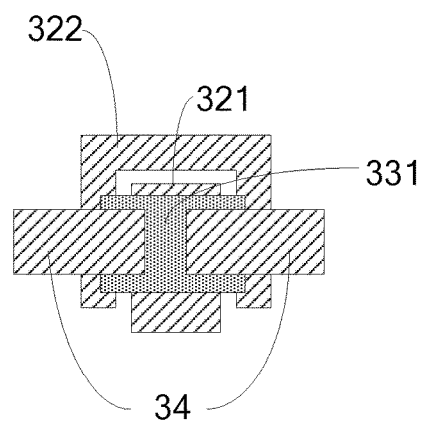
FIG. 3 schematically illustrates a top view of a thin film transistor provided by the embodiments of the present disclosure.

In at least some embodiments of the present disclosure, as illustrated in FIG. 3, the light shielding layer 322 is shaped as a rectangular frame with an opening at one side. The gate 321 extends into the opening of the rectangular frame, and the projection (in the direction perpendicular to the paper) of the active layer 331 on the plane where the light shielding layer 322 is arranged does not go beyond a boundary of the rectangular frame, i.e., the periphery of the pattern 322.

As illustrated in FIG. 3, the light shielding layer 322 around the three sides of the gate 321 of the thin film transistor is provided to block the light that is irradiated to the active layer 331 through the insulating layer and prevent the external light from entering the active layer 331 and impacting the active layer 331.

The embodiments of the present disclosure do not limit the size, thickness and or like of the light shielding layer 322, and thus those skilled in the art may set them as required.

Figure 4:
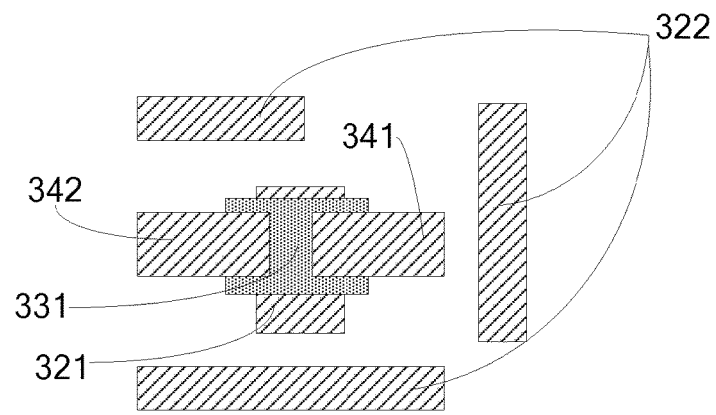
FIG. 4 schematically illustrates a top view of a thin film transistor provided by another embodiment of the present disclosure.

In at least some embodiments of the present disclosure, as illustrated in FIG. 4, the light shielding layer 322 is strip-shaped and arranged close to the projection of the source/drain electrode layer 34 on the plane where the light shielding layer 322 is located.

As illustrated in FIG. 4, the provision of the light shielding layer 322 near the projection of the source/drain electrode layer 34 of the thin film transistor on the plane where the light shielding layer 322 is located can block the light irradiated to the active layer 331 through the insulating layer and prevent the external light from entering the active layer 331 and impacting the active layer 331. It should be noted that, the strip-shaped light shielding layer 322 can be arranged close to the projection of the drain electrode 342 of the thin film transistor on the plane where the light shielding layer 322 is located, or close to the projection of the source electrode 341 of the thin film transistor on the plane where the light shielding layer 322 is located, which are not limited in the embodiments of the present disclosure. In one embodiment, as illustrated in FIG. 4, two of the three strip-shaped light shielding layers 322 are arranged parallel to each other on opposite sides of the active layer, and the rest one light shielding layer 322 is arranged perpendicular to them.

In at least some embodiments of the present disclosure, as illustrated in FIG. 2, the light shielding layer 212 includes a direct irradiation light shielding layer 2121 and/or a reflection light shielding layer 2122. The direct irradiation light shielding layer 2121 is configured to prevent the light from directly entering the active layer 23 through the insulating layer 22. The reflection light shielding layer 2122 is configured to prevent the light from being irradiated to the source/drain electrode layer 24 through the insulating layer 22 and then entering the active layer 23 after reflected by the surface of the source/drain electrode layer 24.

As illustrated in FIG. 2, by providing the direct irradiation light shielding layer 2121 arranged in the same layer as the gate electrode 211, the light directly directed to the active layer 23 via the insulating layer 22 can be blocked, and the active layer 23 can be protected from the adverse impact of the light directly irradiated to the active layer 23 on the active layer 23. By providing the reflection light shielding layer 2121 arranged in the same layer as the gate electrode 211, the light which is irradiated to the source/drain electrode layer 24 via the insulating layer 22 and then reflected to the active layer 23 by the surface of the source/drain electrode layer 24 can be blocked, and the light, which is irradiated to the source/drain electrode layer 24 via the insulating layer 22, then reflected to the surface of the gate electrode 211 by the surface of the source/drain electrode layer 24, and finally reflected to the active layer 23 by the surface of the gate electrode 211, can also be blocked. Therefore, the active layer 23 can be prevented from the adverse impact of the external light reflected to the active layer 23 on the active layer 23.

Figure 5:
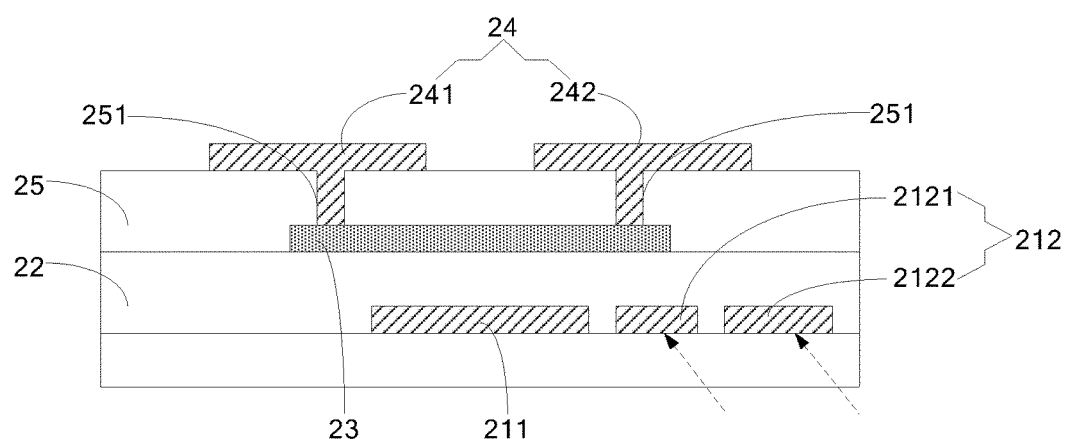
FIG. 5 schematically illustrates a configuration of a thin film transistor provided by another embodiment of the present disclosure.

In at least some embodiments of the present disclosure, as illustrated in FIG. 5, an etch stop layer 25 is formed between the active layer 23 and the source/drain electrode layer 24. The etch stop layer 25 is provided therein with via holes 251 which are configured to electrically connect the active layer 23 and the source/drain electrode layer 24. For example, the source electrode 241 is connected to the active layer 23 by via hole 251, and the drain electrode 242 is connected to the active layer 23 by via hole 251.

As illustrated in FIG. 5, the etch stop layer 25 can be formed on the active layer 23 by a patterning process. Via holes 251 are disposed in the etch stop layer 25 to facilitate the electrically connection between the active layer 23 and the source/drain electrode layer 24 on the etch stop layer 25.

The active layer is usually made of a non-oxide semiconductor material, such as silicon, amorphous silicon, polycrystalline silicon or the like. In the embodiments of the present disclosure, the active layer 23 is made of an oxide semiconductor material. The thin film transistor with the active layer of an oxide semiconductor material has a better performance than the thin film transistor with the active layer of a non-oxide semiconductor material. For example, compared with amorphous silicon, oxide semiconductor material can improve the performances of a thin film transistor, in mobility, on-state current, switching characteristic or the like, for example. Compared with polycrystalline silicon, oxide semiconductor material has better uniformity, there is no need to add a compensating circuit, and oxide semiconductor material has advantages in the masking number and the manufacturing difficulty and hence has advantages in manufacturing large size displays. Additionally, the oxide semiconductor thin film can be simply fabricated by a sputtering method or the like without any added equipment, and thus it has cost advantage.

Figure 6:
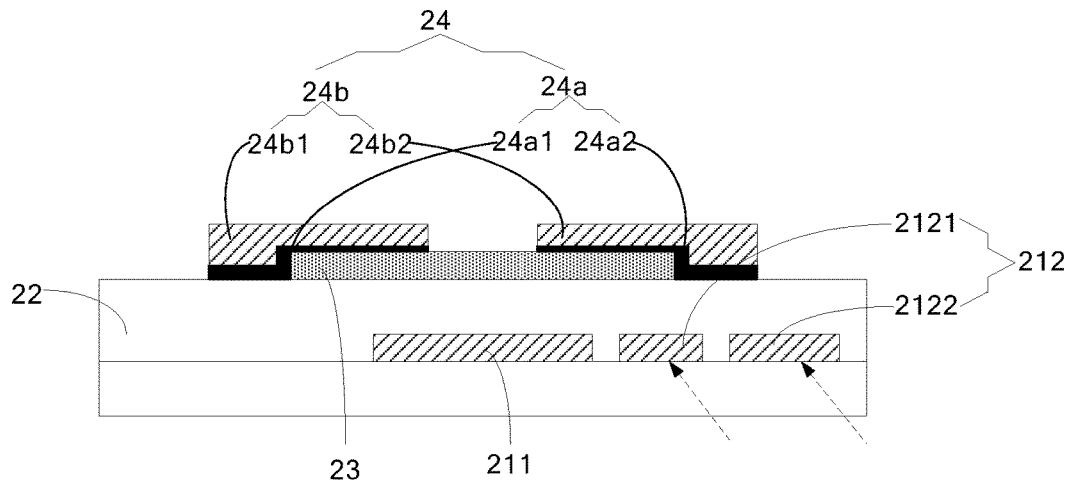
FIG. 6 schematically illustrates a configuration of a thin film transistor provided by also another embodiment of the present disclosure.

In at least some embodiments of the present disclosure, as illustrated in FIG. 6, the source/drain electrode layer 24 is in a double-layer structure, comprising a first source/drain electrode layer pattern 24a and a second source/drain electrode layer pattern 24b formed on the first source/drain electrode layer pattern 24a. The first source/drain electrode layer pattern 24a is arranged closer to the active layer 23, and the material of the first source/drain electrode layer pattern 24a may be Mo—Nb alloy, Mo—W alloy or Mo—Ti alloy.

For example, the first portion 24a1 of the first source/drain electrode layer pattern 24a and the first portion 24b1 of the second source/drain electrode layer pattern 24b form the source electrode 241 of the source/drain electrode layer 24. The second portion 24a2 of the first source/drain electrode layer pattern 24a and the second portion 24b2 of the second source/drain electrode layer pattern 24b form the drain electrode 242 of the source/drain electrode layer 24.

Since the material such as Mo—Nb alloy, Mo—W alloy or Mo—Ti alloy or the like have better optical absorption and electrical conductivity, the first source/drain electrode layer pattern 24a in the source/drain electrode layer 24 closer to the active layer 23 is made of the material such as Mo—Nb alloy, Mo—W alloy or Mo—Ti alloy or the like. After the external light is irradiated to the source/drain electrode layer 24 via the insulating layer 22, the first source/drain electrode layer pattern 24a closer to the active layer 23 can absorb the light. So, there is almost no light or little light reflected to the active layer 23 by the surface of the source/drain electrode layer 24, and thus the adverse impact of the external light on the active layer 23 can be decreased.

It is noted that, the thin film transistor described above can be applied to various kinds of display devices such as LCD display device, OLED display device or the like; especially, as for the OLED display device, both top-emitting OLED and the bottom-emitting OLED can adopt the disclosed thin film transistor.

Figure 7:
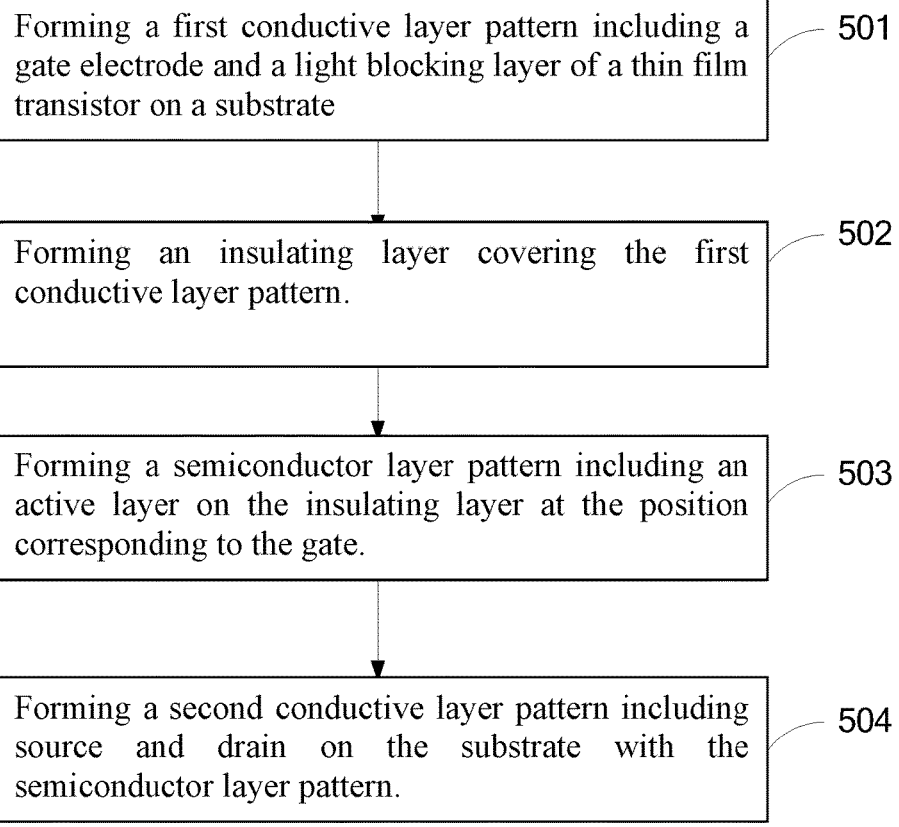
FIG. 7 is a flow chart showing a process of manufacturing a thin film transistor provided by the embodiments of the present disclosure.

As illustrated in FIG. 7, the embodiment of the present disclosure also provides a process of manufacturing the thin film transistor in FIG. 2.

Step 501: forming a first conductive layer pattern including a gate electrode and a light shielding layer of a thin film transistor on a base substrate.

The substrate 20 may be made of, for example, alkali-free glass because alkali glass has a high metal impurity content, such as Al, Ba, Na or the like, which may diffuse in a high temperature process. Alternatively, the substrate 20 may also be made of unidirectional transparent glass. The substrate 20 which is made of unidirectional transparent glass can decrease the external light entering the active layer since the unidirectional transparent glass can reflect the external light to be irradiated to the thin film transistor, and thus the adverse impact of the external light on the active layer may be decreased.

Figure 2A:
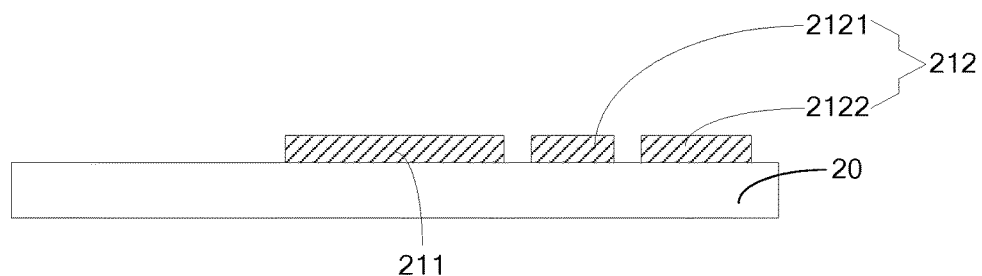
FIG. 2a-FIG. 2c respectively schematically illustrate process steps of manufacturing the thin film transistor in FIG. 2.

For example, as illustrated in FIG. 2a, on the pre-cleaned substrate 20, the first conductive layer is formed by a film forming method such as sputtering and deposition. Then, the first conductive layer pattern including the gate electrode 211 and the light shielding layer 212 of the thin film transistor is formed by a sequence of steps including photoresist coating, exposing with a mask, developing, etching and so on. The first conductive layer is usually made of a layer of conductive film, or may be made of a plurality layers of conductive films. Generally, the conductive film is of a metallic material.

There are various kinds of methods for fabricating the first conductive layer. For example, the film can be deposited through PECVD (Plasma Enhanced Chemical Vapor Deposition), LPCVD (Low Pressure Chemical Vapor Deposition), APCVD (Atmospheric Pressure Chemical Vapor Deposition), ECR-CVD (Electron Cyclotron Resonance-Chemical Vapor Deposition), and the embodiments of the present disclosure are not limited to these processes.

Step 502: forming an insulating layer covering the first conductive layer pattern.

Figure 2B:
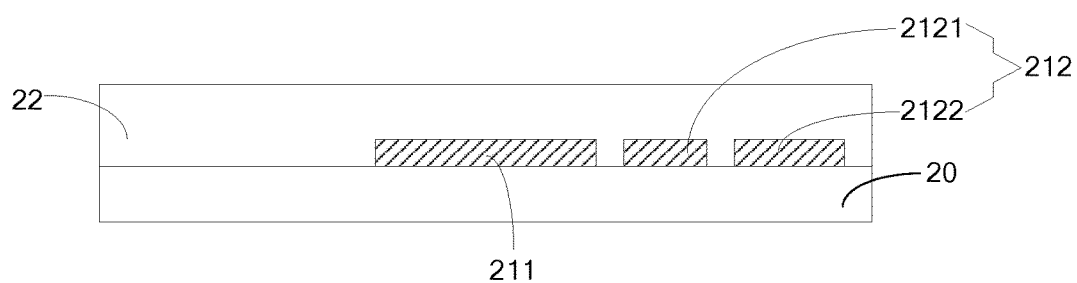

For example, as illustrated in FIG. 2b, the insulating layer 22 may be fabricated on the base substrate with the first conductive layer formed thereon through PECVD, LPCVD, APCVD, ECR-CVD or the like. The thickness of the insulating layer 22 may be chosen according to the specific process, and the embodiments of the present disclosure are not limited in this way.

Step 503: forming a semiconductor layer pattern including an active layer on the insulating layer at the position corresponding to the gate.

Figure 2C:
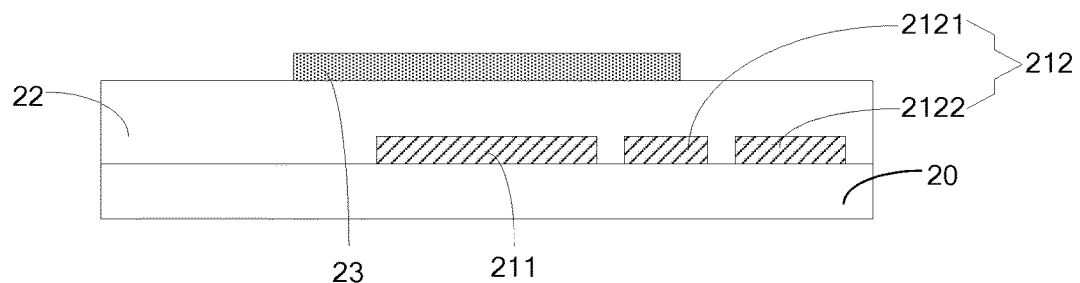

As illustrated in FIG. 2c, the semiconductor layer pattern including the active layer 23 is formed on the insulating layer 22 at the position corresponding to the gate electrode 211. The material of the active layer 23 is, for example, oxide semiconductor. The semiconductor layer pattern may be formed through a patterning process.

Step 504: forming a second conductive layer pattern including a source electrode and a drain electrode on the base substrate with the semiconductor layer pattern.

For example, as illustrated in FIG. 2, a second conductive layer pattern including a source electrode 241 and a drain electrode 242 is formed on the base substrate 20 with the semiconductor layer pattern. The second conductive layer pattern including the source electrode 241 and the drain electrode 242 is formed by patterning a conductive layer deposited on the semiconductor layer.

In at least some embodiments of the present disclosure, as illustrated in FIG. 5, after forming the semiconductor layer pattern and before forming the second conductive layer pattern, the manufacturing process of the thin film transistor further comprises: forming an etch stop layer on the base substrate with the semiconductor layer pattern thereon. The etch stop layer has via holes therein at the position corresponding to the source/drain electrode layer to be formed, and the via holes are configured to electrically connect the active layer and the source/drain electrode layer.

When the active layer is made of an oxide semiconductor material, the arrangement of the etch stop layer can prevent the active layer from being etched by the etchant while the source/drain electrode layer are etched to form the source and drain electrodes, and thus the performance of the active layer can be prevented from becoming unstable.

In some embodiments of the present disclosure, as illustrated in FIG. 6, the second conductive layer pattern of the thin film transistor is in a double-layer structure, and its manufacturing process involves two approaches. One of the approaches involves depositing two layers of conductive materials, which may be two of Mo—Nb alloy, Mo—W alloy and Mo—Ti alloy, and patterning the two layers of conductive materials to form a source/drain electrode layer pattern in a double-layer structure by one patterning process. The other of the approaches includes the following steps: depositing a first layer of conductive material which may be Mo—Nb alloy, Mo—W alloy or Mo—Ti alloy; patterning the first layer of conductive material to form the first source/drain electrode layer pattern by one patterning process; depositing a second layer conductive material over the first source/drain electrode layer pattern; and patterning the second layer of conductive material to form the second source/drain electrode layer pattern by another one patterning process. In the first approach, the source/drain electrode layer pattern in a double-layer structure can be fabricated simply by one patterning process, and thus the manufacturing process may be simplified.

The thin film transistor provided by an embodiment of the present disclosure comprises a gate electrode, an insulating layer, an active layer and a source/drain electrode layer formed in order. Additionally, the thin film transistor further includes a light shielding layer which may block the light from entering the active layer via the insulating layer. The light shielding layer and the gate electrode are arranged in the same layer and electrically unconnected with each other. Therefore, the thin film transistor provided by the embodiment of the present disclosure can prevent the external light from entering the active layer via the insulating layer by way of the light shielding layer arranged in the same layer as the gate electrode, so as to decrease the external light entering the active layer and thus decrease the adverse impact of the external light on the active layer. Therefore, a thin film transistor with more stable performance can be obtained.

Embodiment 2

Figure 8:
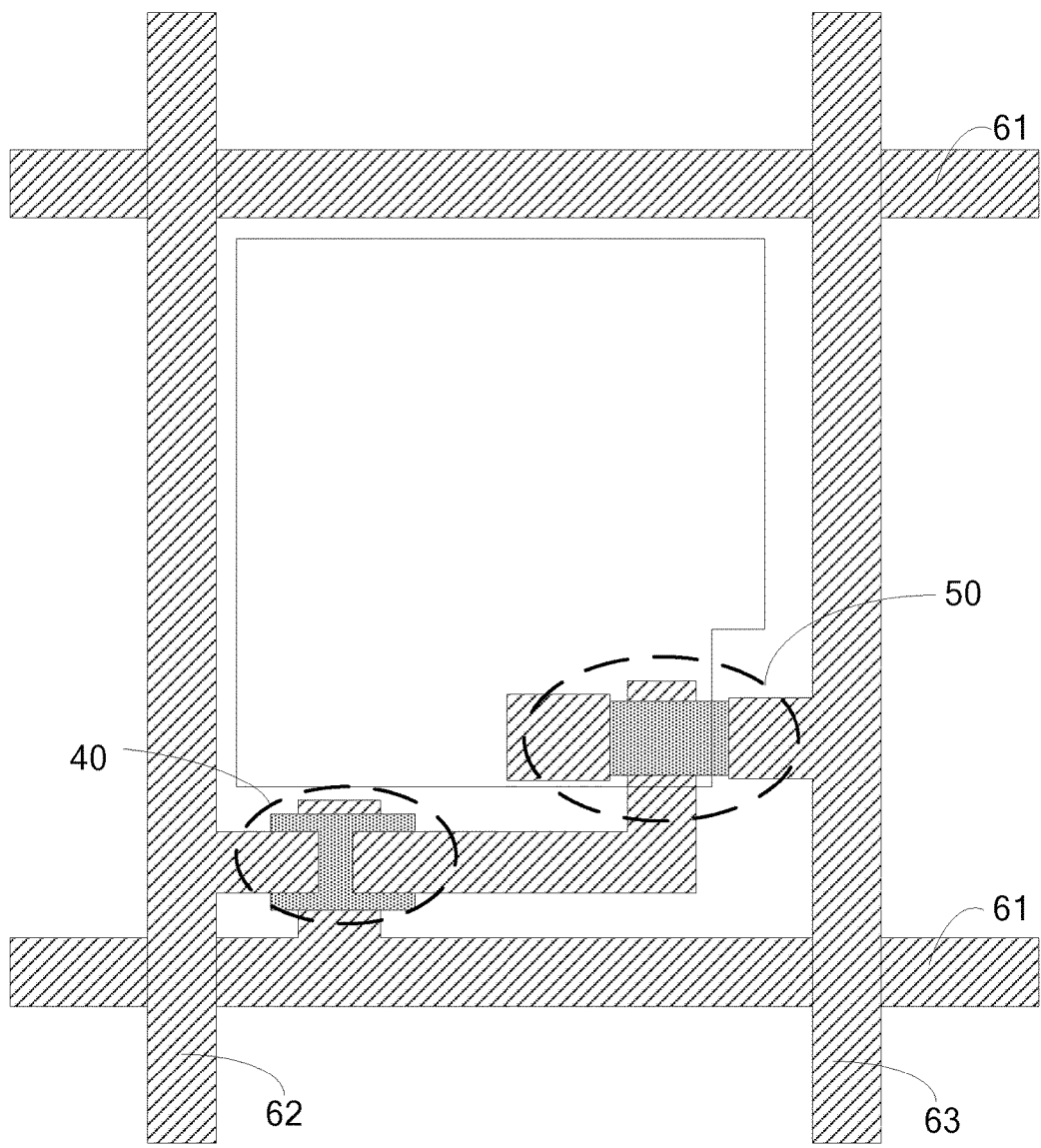
FIG. 8 schematically illustrates a configuration of an array substrate provided by the embodiments of the present disclosure.

This embodiment of the present disclosure provides an array substrate. The array substrate, such as the array substrate of the OLED display device, comprises a base substrate with any type of the thin film transistors described above formed thereon. As illustrated in FIG. 8, the array substrate comprises, for example, two scan lines 61 and a data line 62 that intersects with the scan lines, and a power line 63 parallel to the data line 62. The two scan lines 61, the data line 62 and the power line 63 define one pixel unit. A switching thin film transistor 40 and a driving thin film transistor 50 are formed in the pixel unit. The switching thin film transistor 40 and the driving thin film transistor 50 are the thin film transistor described above. In the present embodiment, the power line 63 may also be considered as a date line that provides electrical powers to the driving transistor 50.

Figure 9:
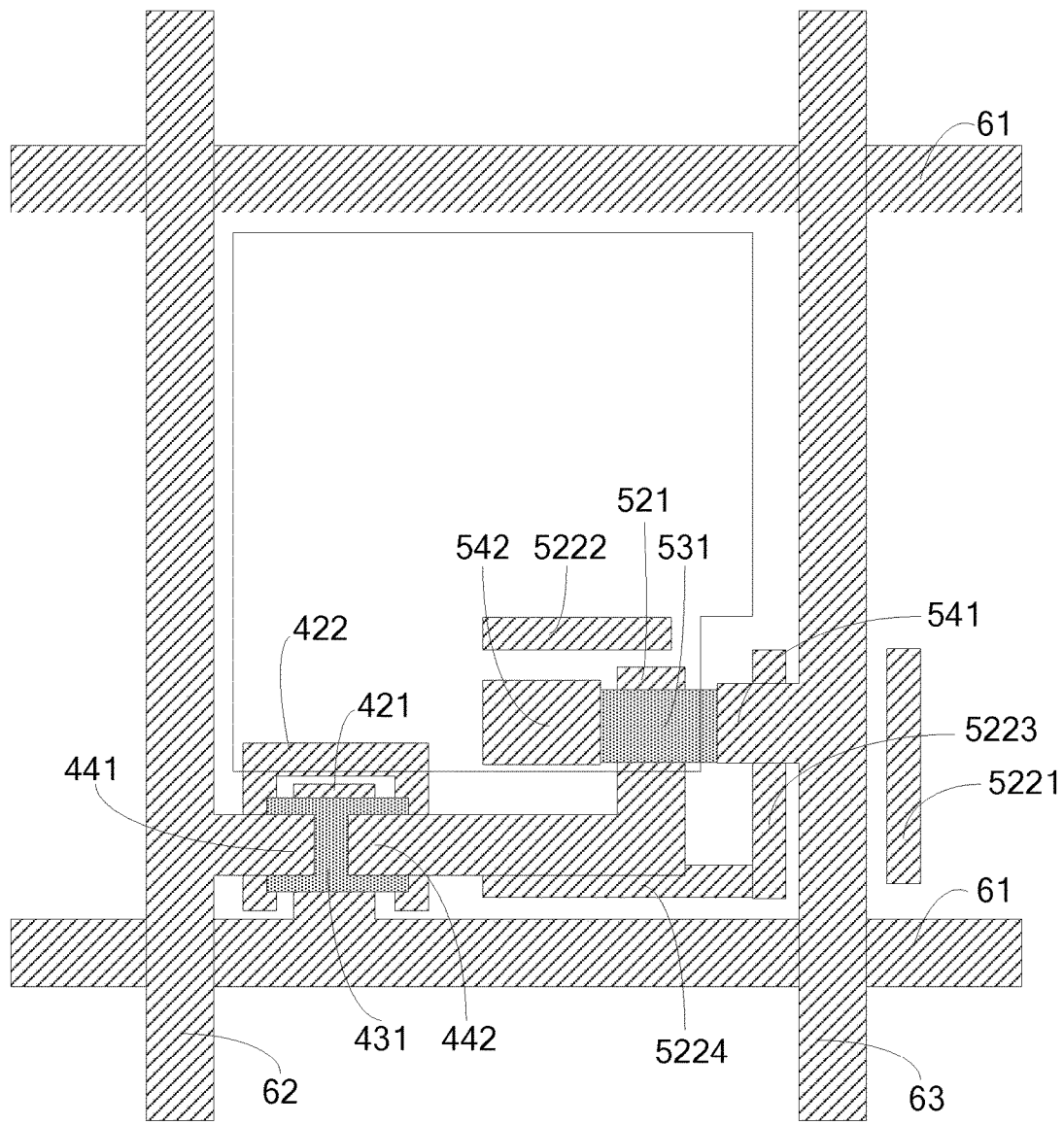
FIG. 9 schematically illustrates a configuration of an array substrate provided by another embodiment of the present disclosure.

In at least some embodiments of the present disclosure, as illustrated in FIG. 9, the light shielding layer of the switching thin film transistor 40 comprises a first direct irradiation light shielding layer 422. The first direct irradiation light shielding layer 422 is shaped as a rectangular frame with an opening on one side. The gate electrode 421 of the switching thin film transistor 40 extends into the opening of the rectangular frame, and the projection of the active layer 431 of the switching thin film transistor 40 on the surface of the base substrate does not go beyond a boundary of the rectangular frame.

As illustrated in FIG. 9, the first direct irradiation light shielding layer 422 is provided around the three sides of the gate electrode of the switching thin film transistor 40 and can block the light directly irradiated to the active layer 431 via the insulating layer and prevent the external light from entering the active layer 431 and impacting the active layer 431.

In at least some embodiments of the present disclosure, as illustrated in FIG. 8 and FIG. 9, the light shielding layer of the driving thin film transistor 50 comprises a first reflection light shielding layer 5221. The first reflection light shielding layer 5221 is positioned outside the pixel unit and close to the projection of the power line 63 on the base substrate. That is, the first reflection light shielding layer 5221 is positioned between this pixel unit and its adjacent pixel unit that is on the power line 63 side. The first reflection light shielding layer 5221 is strip-shaped and parallel to the power line 63.

As illustrated in FIG. 9, the first reflection light shielding layer 5221 is arranged at the position of the driving thin film transistor 50 outside the pixel unit and closer to the power line 63, and can block the light irradiated to the source/drain electrode layer via the insulating layer at the position of the power line 63 and then reflected to the active layer 531 by the surface of the source/drain electrode layer, and prevent the external light from being reflected into the active layer 531 and impacting the active layer 531.

In at least some embodiments of the present disclosure, as illustrated in FIG. 9, the light shielding layer of the driving thin film transistor 50 comprises a second reflection light shielding layer 5222. The second reflection light shielding layer 5222 is positioned within the pixel unit. The second reflection light shielding layer 5222 is positioned close to the projection of the drain electrode 542 of the driving thin film transistor 50 on the base substrate. The second reflection light shielding layer 5222 is strip-shaped and parallel to the scan line 61.

As illustrated in FIG. 9, the second reflection light shielding layer 5222 is arranged near the driving thin film transistor 50, at the position that is within the pixel unit and close to the projection of the drain electrode 542 of the driving thin film transistor 50 on the surface of the base substrate, and can block the light irradiated to the source/drain electrode layer via the insulating layer at the side of the drain electrode 542 and then reflected to the active layer 531 by the surface of the source/drain electrode layer, and prevent the external light from being reflected into the active layer 531 and impacting the active layer 531.

In at least some embodiments of the present disclosure, as illustrated in FIG. 8 and FIG. 9, the light shielding layer of the driving thin film transistor 50 further comprises a third reflection light shielding layer 5223. The third reflection light shielding layer 5223 is positioned within the pixel unit and close to the power line 63. The third reflection light shielding layer 5223 is strip-shaped and parallel to the power line 63.

As illustrated in FIG. 9, the third light shielding layer 5223 is arranged near the driving thin film transistor 50, at the position that is within the pixel unit and close to the power line 63, and can block the light irradiated to the source/drain electrode layer via the insulating layer within the region of the pixel unit at the position close to the power line 63 and then reflected to the active layer 531 by the surface of the source/drain electrode layer, and prevent the external light from being reflected into the active layer 531 and impacting the active layer 531.

In at least some embodiments of the present disclosure, as illustrated in FIG. 9, the light shielding layer of the driving thin film transistor 50 further comprises a second direct irradiation light shielding layer 5224. The second direct irradiation light shielding layer 5224 is positioned within the pixel unit and close to the scan line 61. The second direct irradiation light shielding layer 5224 is strip-shaped and parallel to the scan line 61.

As illustrated in FIG. 9, the second direct irradiation light shielding layer 5224 is provided within the pixel unit at the position of the driving thin film transistor 50 and close to the scan line 61, and can block the light directly irradiated to the active layer 531 via the insulating layer and prevent the external light from directly entering the active layer 531 and impacting the active layer 531.

It should be noted that, the embodiments of the present disclosure do not limit the size, thickness or the like of the first direct irradiation light shielding layer 422, the first reflection light shielding layer 5221, the second reflection light shielding layer 5222, the third reflection light shielding layer 5223 and the second direct irradiation light shielding layer 5224, and thus those skilled in the art can choose them as required.

Figure 10:
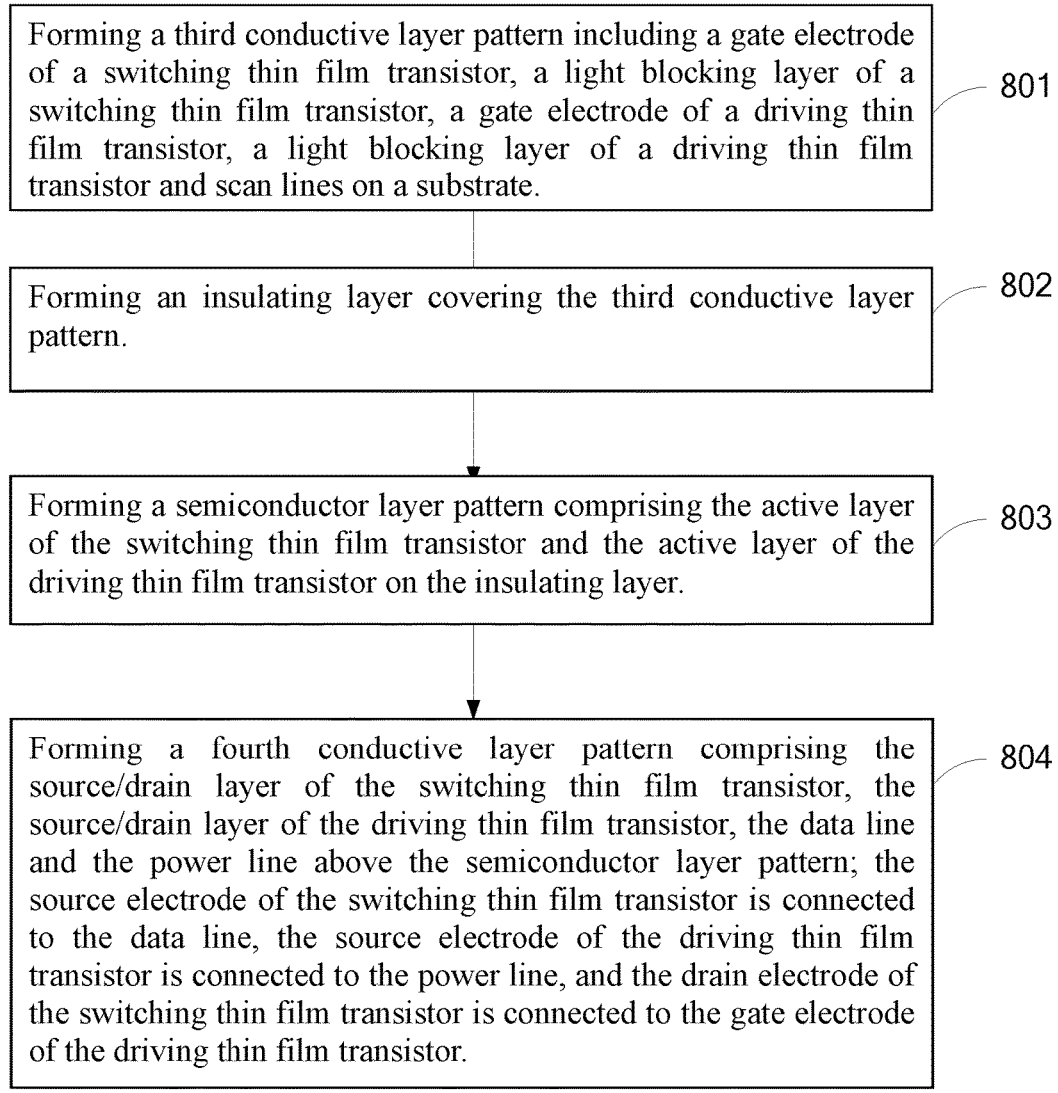
FIG. 10 is a flow chart showing a process of manufacturing an array substrate provided by the embodiments of the present disclosure.

The embodiment of the present disclosure also provides a process of manufacturing the array substrate described above, as illustrated in FIG. 10, comprising the following operations:

Step 801: forming a third conductive layer pattern including a gate electrode of a switching thin film transistor, a light shielding layer of a switching thin film transistor, a gate electrode of a driving thin film transistor, a light shielding layer of a driving thin film transistor and scan lines on a base substrate.

The substrate may be made of, for example, alkali-free glass, because alkali glass has a high metal impurity content such as Al, Ba, Na or the like which may diffuse in the high temperature process.

The specific process of manufacturing the third conductive layer pattern may be referred to the step 501 and thus will not described again here.

Step 802: forming an insulating layer covering the third conductive layer pattern.

The insulating layer may be fabricated on the base substrate with the third conductive layer formed thereon through PECVD, LPCVD, APCVD, ECR-CVD or the like. The thickness of the insulating layer may be chosen according to the specific process, and the embodiments of the present disclosure are not limitative thereto.

Step 803: forming a semiconductor layer pattern comprising the active layer of the switching thin film transistor and the active layer of the driving thin film transistor on the insulating layer.

The specific process of manufacturing the semiconductor layer pattern may be referred to the step 503 and thus will not described again here.

Step 804: forming a fourth conductive layer pattern comprising the source/drain electrode layer of the switching thin film transistor, the source/drain electrode layer of the driving thin film transistor, the data line and the power line above the semiconductor layer pattern. The source electrode of the switching thin film transistor is connected to the data line, the source electrode of the driving thin film transistor is connected to the power line, and the drain electrode of the switching thin film transistor is connected to the gate electrode of the driving thin film transistor.

As illustrated in FIG. 7, a top conductive film, deposited above the semiconductor layer pattern, is patterned to form the fourth conductive layer pattern including the source/drain electrode layer of the switching thin film transistor, the source/drain electrode layer of the driving thin film transistor, the data line and the power line by patterning process.

In at least some embodiments of the present disclosure, after forming the semiconductor layer pattern and before forming the fourth conductive layer pattern, the manufacturing process further include the following operations.

On the base substrate with the semiconductor layer pattern formed thereon, there is formed an etch stop layer which has via holes therein at the positions respectively corresponding to the source/drain electrode layer of the switching thin film transistor to be formed and the source/drain electrode layer of the driving thin film transistor to be formed. The via holes are configured to electrically connect the active layer of the switching thin film transistor to the source/drain electrode layer of the switching thin film transistor, and electrically connect the active layer of the driving thin film transistor to the source/drain electrode layer of the driving thin film transistor.

The etch stop layer is formed on the base substrate with the semiconductor layer pattern formed thereon, and then the top conductive film is formed above the etch stop layer. The etch stop layer has via holes therein, which are used to electrically connect the active layer of the switching thin film transistor to the source/drain electrode layer of the switching thin film transistor, and electrically connect the active layer of the driving thin film transistor to the source/drain electrode layer of the driving thin film transistor.

When the active layer is of oxide semiconductor material, the arrangement of the etch stop layer can prevent the active layer from being etched by the etchant while the source/drain electrode layer are etched to form the source and drain electrodes, and thus the performance of the active layer can be prevented from becoming unstable.

Therefore, the thin film transistor provided by the embodiments of the present disclosure can prevent the external light from entering the active layer via the insulating layer by way of the light shielding layer arranged in the same layer as the gate electrode, so as to decrease the external light entering the active layer and thus decrease the adverse impact of the external light on the active layer. Therefore, a thin film transistor with more stable performance can be fabricated.

What is described above is related to the illustrative embodiments of the disclosure only and not limitative to the scope of the disclosure; the scopes of the disclosure are defined by the accompanying claims.

The present application claims the priority of Chinese patent application No. 201510301084.7 filed on Jun. 3, 2015, the disclosure of which is incorporated herein by reference in its entirety.

What is claimed is:

1. A thin film transistor, comprising:
a gate electrode, an insulating layer, an active layer, and a source/drain electrode layer,
wherein the thin film transistor further comprises a light shielding layer which is configured to block light from entering the active layer via the insulating layer, the light shielding layer and the gate electrode are arranged in a same layer and electrically unconnected with each other, and the light shielding layer is provided on at least two sides of the active layer, wherein the light shielding layer comprises at least one of a direct irradiation light shielding layer and a reflection light shielding layer;
the direct irradiation light shielding layer is configured to prevent the light from entering the active layer via the insulating layer; and the reflection light shielding layer is configured to prevent light from being irradiated to the source/drain electrode layer via the insulating layer and then being reflected to the active layer by a surface of the source/drain electrode layer.

2. The thin film transistor of claim 1, wherein the light shielding layer is shaped as a rectangular frame with an opening at one side, the gate electrode extends into the opening of the rectangular frame, and a projection of the active layer on a plane where the light shielding layer is located does not go beyond a boundary of the rectangular frame.

3. The thin film transistor of claim 1, wherein the light shielding layer is strip-shaped and close to a projection of the source/drain electrode layer on a plane where the light shielding layer is located.

4. The thin film transistor of claim 1, wherein an etch stop layer is provided between the active layer and the source/drain electrode layer, and the etch stop layer comprises via holes for electrically connecting the active layer and the source/drain electrode layer.

5. The thin film transistor of claim 1, wherein a material of the active layer is oxide semiconductor.

6. The thin film transistor of claim 1, wherein the source/drain electrode layer is in a double-layer structure and comprises a first source/drain electrode layer pattern and a second source/drain electrode layer pattern formed over the first source/drain electrode layer pattern; the first source/drain electrode layer pattern is arranged close to the active layer; and a material of the first source/drain electrode layer pattern is selected from Mo—Nb alloy, Mo—W alloy or Mo—Ti alloy.

7. The thin film transistor of claim 1, wherein the light shielding layer is provided at opposite sides of the active layer.

8. The thin film transistor of claim 1, wherein an orthographic projection of the source/drain electrode layer on a plane where the light shielding layer is located is overlapped with the light shielding layer.

9. The thin film transistor of claim 1, wherein an orthographic projection of the active layer on a plane where the light shielding layer is located is overlapped with the light shielding layer.

10. An array substrate comprising a base substrate and thin film transistors on the base substrate, and a plurality of scan lines and a plurality of data lines that are intersected with each other,
wherein the plurality of scan lines and the plurality of data lines define a plurality of pixel units, at least a switching thin film transistor and a driving thin film transistor are arranged in each pixel unit, and the thin film transistors comprise the switching thin film transistor and the driving thin film transistor,
wherein each of the thin film transistors comprises a gate electrode, an insulating layer, an active layer, and a source/drain electrode layer, and
wherein each of the thin film transistors further comprises a light shielding layer which is configured to block light from entering the active layer via the insulating layer, the light shielding layer and the gate electrode are arranged in a same layer and electrically unconnected with each other, and the light shielding layer is provided on at least two sides of the active layer.

11. The array substrate according to claim 10, wherein the light shielding layer is shaped as a rectangular frame with an opening at one side, the gate electrode extends into the opening of the rectangular frame, and a projection of the active layer on a plane where the light shielding layer is located does not go beyond a boundary of the rectangular frame.

12. The array substrate according to claim 10, wherein the light shielding layer is strip-shaped and close to a projection of the source/drain electrode layer on a plane where the light shielding layer is located.

13. The array substrate according to claim 10, wherein the light shielding layer comprises at least one of a direct irradiation light shielding layer and a reflection light shielding layer;
the direct irradiation light shielding layer is configured to prevent the light from entering the active layer via the insulating layer; and the reflection light shielding layer is configured to prevent light from being irradiated to the source/drain electrode layer via the insulating layer and then being reflected to the active layer by a surface of the source/drain electrode layer.

14. The array substrate according to claim 10, wherein an etch stop layer is provided between the active layer and the source/drain electrode layer, and the etch stop layer comprises via holes for electrically connecting the active layer and the source/drain electrode layer.

15. The array substrate according to claim 10, wherein a material of the active layer is oxide semiconductor.

16. The array substrate according to claim 10, wherein the source/drain electrode layer is in a double-layer structure and comprises a first source/drain electrode layer pattern and a second source/drain electrode layer pattern formed over the first source/drain electrode layer pattern; the first source/drain electrode layer pattern is arranged close to the active layer; and a material of the first source/drain electrode layer pattern is selected from Mo—Nb alloy, Mo—W alloy or Mo—Ti alloy.

17. A process of manufacturing a thin film transistor comprising:
    forming a first conductive layer pattern including a gate electrode and a light shielding layer of the thin film transistor on a base substrate;
    forming an insulating layer covering the first conductive layer pattern;
    forming a semiconductor layer pattern including an active layer on the insulating layer at a position corresponding to the gate electrode; and
    forming a second conductive layer pattern including a source electrode and a drain electrode on the base substrate with the semiconductor layer pattern formed thereon,
    wherein the light shielding layer is provided on at least two sides of the active layer;
    the light shielding layer comprises at least one of a direct irradiation light shielding layer and a reflection light shielding layer;
    the direct irradiation light shielding layer is configured to prevent light from entering the active layer via the insulating layer; and the reflection light shielding layer is configured to prevent light from being irradiated to the source/drain electrode layer via the insulating layer and then being reflected to the active layer by a surface of the source/drain electrode layer.

* * * * *